(12) United States Patent
Eastep

(10) Patent No.: US 6,455,326 B1
(45) Date of Patent: Sep. 24, 2002

(54) ENHANCED PROCESS CAPABILITY FOR SPUTTERED FERROELECTRIC FILMS USING LOW FREQUENCY PULSED DC AND RF POWER SUPPLIES

(75) Inventor: Brian Eastep, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/570,680

(22) Filed: May 15, 2000

(51) Int. Cl.$^7$ .......................... H01L 21/00; H01L 21/20; H01L 21/44; H01L 29/76
(52) U.S. Cl. .......................... 438/3; 438/396; 438/608; 257/295
(58) Field of Search .......................... 438/3, 608, 396; 257/295

(56) References Cited

U.S. PATENT DOCUMENTS

| | | | |
|---|---|---|---|
| 4,756,810 A | * 7/1988 | Lamnont, Jr. et al. | 204/192.3 |
| 5,043,049 A | * 8/1991 | Takenaka | 204/192.15 |
| 5,104,690 A | * 4/1992 | Greenwald | 427/126.3 |
| 5,216,631 A | * 6/1993 | Sliwa, Jr. | 365/174 |
| 5,254,217 A | * 10/1993 | Maniar et al. | 438/608 |
| 5,745,336 A | * 4/1998 | Saito et al. | 361/321.5 |
| 5,889,299 A | * 3/1999 | Abe et al. | 257/295 |
| 6,198,119 B1 | * 3/2001 | Nabatame et al. | 257/295 |
| 6,211,035 B1 | * 4/2001 | Moise et al. | 438/396 |
| 6,215,231 B1 | * 4/2001 | Newnham et al. | 310/371 |
| 6,278,224 B1 | * 8/2001 | Sawada et al. | 310/334 |
| 6,307,996 B1 | * 10/2001 | Nashimoto et al. | 385/130 |

OTHER PUBLICATIONS

P.J. Kelly, et al., "Control of the Structure and Properties of Aluminum Oxide Coatings deposited by Pulsed Magnetron Sputtering", J. Vac. Sci. Technol. A 17(3), May/Jun. 1999, pp. 945–953.

* cited by examiner

Primary Examiner—Charles Bowers
Assistant Examiner—Chuong A Luu

(57) ABSTRACT

An improved sputtering method for sputter deposition from non-conducting metal oxide, ceramic, and ferroelectric targets is disclosed. Enhancements in deposition rate and composition control have been demonstrated using a pulsed DC sputtering method using a power supply in the frequency range of 100 to 250 KHz and a low frequency RF sputtering method using a power supply in the range of 200 to 500 KHz. The enhancement in composition control comes from an improvement in the sticking efficiencies of the volatile components in ferroelectric films. The low frequency and/or pulsed DC supplies provide lead content control for optimizing ferroelectric performance in pressure regimes that favor better cross wafer composition and thickness uniformity in PVD (Physical Vapor Deposition) sputtering tools. Because of the enhanced composition control, the low frequency pulsed DC and RF supplies can easily match the compositions generated by existing prior art high frequency RF approaches, but with significantly higher deposition rates and more favorable sputter pressure regimes. In addition to the improvements in process capability, the pulsed DC and low frequency supplies do not exhibit the radio frequency interference issues which typically plague RF sputter process repeatability and monitoring capabilities.

5 Claims, 19 Drawing Sheets

Typical "Pulsed DC" Configuration

Typical "RF" Configuration

Typical "Pulsed DC" Configuration

125KHz/1616ns/700w/6mT

125KHz/1616ns/700w/9mT

125KHz/1616ns/700w/12mT

125KHz/3200ns/700w/6mT

125KHz/3200ns/700w/9mT

125KHz/3200ns/700w/12mT

125KHz/3200ns/800w/6mT

125KHz/3200ns/1000w/9mT

250KHz/1600ns/700w/3mT

250KHz/1600ns/700w/6mT

250KHz/1600ns/700w/12mT

135KHz/2944ns/800w/8mT

100KHz/3968ns/700w/9mT

PZT Deposition Detail

| Wafer ID | #08 | #09 | #13 | #10 | #11 | #14 | #16 | #15 | #12 |
|---|---|---|---|---|---|---|---|---|---|
| Nuc Dep Power (watts) | 700 w | 700 w | 700 w | 700 w | 700 w | 700 w | 700 w | 700 w | 700 w |
| Nuc Dep Pressure (mT) | 20 mT | 20 mT | 12 mT | 12 mT | 8 mT | 12 mT | 8 mT | 12 mT | 8 mT |
| Nuc Dep Frequency (KHZ) | N/A | N/A | 125 KHz | 125 KHz | 250 KHz | 125 KHz | 250 KHz | 125 KHz | 250 KHz |
| Nuc Dep Pulse Width (ns) | N/A | N/A | 3200 ns | 3200 ns | 1600 ns | 3200 ns | 1600 ns | 3200 ns | 1600 ns |
| Bulk Dep Power (watts) | 1000 w | 1000 w | 800 w | 800 w | 800 w | 700 w | 700 w | 700 w | 700 w |
| Bulk Dep Pressure (mT) | 6 mT | 6 mT | 8 mT | 8 mT | 8 mT | 3 mT | 3 mT | 6 mT | 6 mT |
| Bulk Dep Frequency (KHZ) | N/A | N/A | 135 KHz | 135 KHz | 135 KHz | 250 KHz | 250 KHz | 125 KHz | 125 KHz |
| Bulk Dep Pulse Width (ns) | N/A | N/A | 2944 ns | 2944 ns | 2944 ns | 1600 ns | 1600 ns | 3200 ns | 3200 ns |
| Cap Dep Power (watts) | 700 w | 700 w | N/A | 700 w | 700 w | 700 w | 700 w | 700 w | 700 w |
| Cap Dep Pressure (mT) | 30 mT | 30 mT | N/A | 12 mT | 12 mT | 12 mT | 12 mT | 12 mT | 12 mT |
| Cap Dep Frequency (KHZ) | N/A | N/A | N/A | 250 KHz | 250 KHz | 250 KHz | 250 KHz | 250 KHz | 250 KHz |
| Cap Dep Pulse Width (ns) | N/A | N/A | N/A | 1600 ns | 1600 ns | 1600 ns | 1600 ns | 1600 ns | 1600 ns |
| Table Rotation (RPM) | 10 | 10 | 10 | 10 | 10 | 10 | 10 | 10 | 10 |
| Pallet Slot # | 6 | 5 | 5 | 5 | 5 | 5 | 5 | 5 | 5 |
| Nuc Dep Time (min) | 5.0 | 5.0 | 3.1 | 3.1 | 3.4 | 3.1 | 3.4 | 3.1 | 3.4 |
| Bulk Dep Time (min) | 30.0 | 30.0 | 37.4 | 33.4 | 33.4 | 50.0 | 50.0 | 37.2 | 37.2 |
| Cap Dep Time (min) | 10.0 | 10.0 | N/A | 4.1 | 4.1 | 4.1 | 4.1 | 4.1 | 4.1 |
| Nuc PZT Thk Target (A) | 150 | 150 | 150 | 150 | 150 | 150 | 150 | 150 | 150 |
| Cap PZT Thk Target (A) | 200 | 200 | N/A | 200 | 200 | 200 | 200 | 200 | 200 |
| Film Structure | Tri-Layer | Tri-Layer | Bi-Layer | Tri-Layer | Tri-Layer | Tri-Layer | Tri-Layer | Tri-Layer | Tri-Layer |
| Nanospec Meas | | | | | | | | | |
| Top | 2189 | 2189 | 1980 | 2002 | 1968 | 2070 | 2072 | 1906 | 1978 |
| Top Cntr | 2164 | 2164 | 2022 | 2038 | 2022 | 2072 | 2067 | 2015 | 1981 |
| Cntr | 2107 | 2107 | 2077 | 2090 | 2086 | 2078 | 2075 | 2018 | 2012 |
| Flat Cntr | 2067 | 2067 | 2172 | 2179 | 2140 | 2114 | 2100 | 2041 | 2041 |
| Flat | 2045 | 2045 | 2240 | 2247 | 2232 | 2198 | 2180 | 2093 | 2097 |
| Left | 2090 | 2090 | 2038 | 2048 | 2049 | 2068 | 2059 | 2004 | 1978 |
| Left Cntr | 2096 | 2096 | 2063 | 2069 | 2082 | 2083 | 2079 | 2024 | 2004 |
| Right Cntr | 2085 | 2085 | 2062 | 2089 | 2082 | 2066 | 2070 | 2004 | 2010 |
| Right | 2063 | 2063 | 2030 | 2053 | 2049 | 2056 | 2054 | 1996 | 1987 |
| Mean | 2101 | 2101 | 2076 | 2091 | 2079 | 2089 | 2084 | 2011 | 2010 |
| Max | 2189 | 2189 | 2240 | 2247 | 2232 | 2198 | 2180 | 2093 | 2097 |
| Min | 2045 | 2045 | 1980 | 2002 | 1968 | 2056 | 2054 | 1906 | 1978 |
| Range | 144 | 144 | 260 | 245 | 264 | 142 | 126 | 187 | 119 |
| Stdev | 47.3 | 47.3 | 80.8 | 76.3 | 74.6 | 43.8 | 38.3 | 49.0 | 38.7 |

*FIG. 8*

ENHANCED PROCESS CAPABILITY FOR SPUTTERED FERROELECTRIC FILMS USING LOW FREQUENCY PULSED DC AND RF POWER SUPPLIES

BACKGROUND OF THE INVENTION

This invention relates generally to a method of sputter deposition (sputtering) of thin film layers in a semiconductor process. More particularly, the present invention relates to a method of sputtering ferroelectric thin films such as PZT (lead zirconate titanate) and the like, as well as other metal oxide thin films using low frequency or pulsed DC power supplies to excite the sputtering target.

The sputtering of ferroelectric and metal oxide thin films is typically done using a high frequency radio frequency (RF) power supply to excite the sputtering target. A typical frequency for the power supply voltage is 13.56 MHz. A typical prior art RF sputtering configuration 10 is shown in FIG. 1. An RF power supply 12 generates an AC waveform, which is impedance matched via an RF matching network 14 to the characteristics of the PZT deposition target 16.

While the high frequency sputtering configuration of FIG. 1 is generally adequate for depositing ferroelectric and metal oxide thin films, there are several problems associated with this technique.

With high frequency RF power supplies, higher deposition pressures are typically required to enhance lead sticking efficiency, which is essential in forming a manufacturable and reliable ferroelectric thin film. Even though higher deposition pressures improve lead sticking efficiency, they do so at the expense of poorer cross-wafer film thickness uniformity due to reductions in plasma confinement by the magnetron sources.

The deposition rate using a high frequency power supply is also somewhat limited because the sputtering only occurs during half of the sinusoidal duty cycle.

Radio Frequency Interference (RFI) issues typically plague RF sputter process repeatability arid monitoring capabilities when a high frequency RF power supply is used. This is a constant problem with the RF supplies currently running on industry standard stutter deposition tools. Levels of RFI are picked up by electronic equipment within the sputtering tool itself, as well as in the surrounding lab or manufacturing areas. This can cause inaccurate readings on monitoring devices such as pressure readouts or the like, as well as occurrences of interference with test equipment in adjacent manufacturing areas.

At high RF frequencies, PZT constituents (lead and calcium) track each other with deposition pressure. The high frequency RF sputtering mode is therefore disadvantaged, because the relatively low peak power for a given average power setting causes the molecules sputtered from the PZT target to be relatively unfragmented.

The sticking efficiency of the lead and lack of fragmentation of the PZT and dopants from the sputtered target source are potentially responsible for nucleation defects that impact the quality oft he PZT crystal orientation. It is difficult to achieve the desired high peak power levels in the RF sputtering mode due to excessive target heating caused by a significant increase in average power.

What is desired, therefore, is a sputtering method for ferroelectric and metal oxide thin films that solves the problems of film thickness uniformity, low deposition rate, RF interference, film constituent tracking, defects impacting crystal orientation, and low wafer throughput found in the prior art RF sputtering method.

SUMMARY OF THE INVENTION

It is, therefore, a principal object of the present invention to provide a sputtering method that solves the RFI problem and other associated problems of the prior art RF high frequency sputtering method.

It is an advantage of the invention that the lead and calcium constituents in a deposited ferroelectric PZT thin film can be separately controlled due to the improvement in lead control over a narrower pressure range.

It is a further advantage of the invention that the pulsed DC sputtering method allows an additional ability to fine tune the lead and calcium constituents with pulse-width selection.

It is a further advantage of the invention t hat the Ti/Zr ratio in deposited ferroelectric PZT films becomes tunable with deposition power.

It is a further advantage of the invention that improvements in preferred PZT crystal orientation are obtained when compared to compositions generated using the prior art high frequency sputtering method, producing thin films with enhanced ferroelectric performance.

It is a further advantage of the invention that an increased range for lead contents from a given deposition target allows multi-layer depositions for enhanced PZT ferroelectric performance from a single sputtering target.

It is yet a further advantage of the invention that increased wafer throughput can be generated, reducing the cost of PZT processing.

According to the present invention a sputtering method is provided as an alternative to the prior art sputtering method using high frequency (13.56 MHz) RF power supplies for sputter deposition from nonconducting metal oxide, ceramic, and ferroelectric targets. Enhancements in deposition rate and composition control have been demonstrated using a pulsed DC sputtering method using a power supply in the frequency range of 100 to 250 KHz and a low frequency RF sputtering method using a power supply in the range of 200 to 500 KHz. The enhancement in composition control comes from an improvement in the sticking efficiencies of the volatile components in ferroelectric films. The low frequency and/or pulsed DC supplies provide lead content control for optimizing ferroelectric performance in pressure regimes that favor better cross-wafer composition and thickness uniformity in PVD (Physical Vapor Deposition) sputtering tools. Because of the enhanced composition control, the low frequency pulsed DC and RF supplies can easily match the compositions generated by existing prior art high frequency RF approaches, but with significantly higher deposition rates and more favorable sputter pressure regimes. In addition to the improvements in process capability, the pulsed DC and low frequency supplies do not exhibit the radio frequency interference issues which typically plague RF sputter process repeatability and monitoring capabilities.

The sputtering methods of the present invention can be used to obtain similar enhancements in other ferroelectric bodies as well. The application of low frequency pulsed DC in producing sputtered Aluminum Oxide (Al2O3) and Iridium Oxide (IrOX) films for applications in ferroelectric processing would have significant benefits such as improved deposition rates, improved film quality, and elimination of arcing from target surface poisoning.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 8 is a table detailing the RF sputtering process conditions of the present invention on nine different wafers;

DETAILED DESCRIPTION

Figure 2:
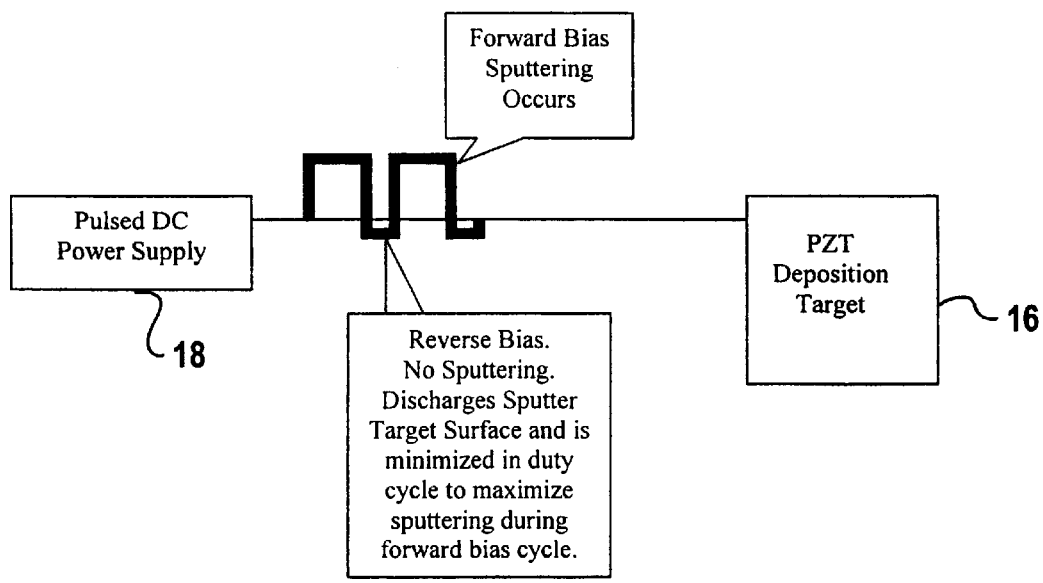
FIG. 2 is a block diagram of a "Pulsed DC" sputtering configuration according to the present invention.
Figure 3A:
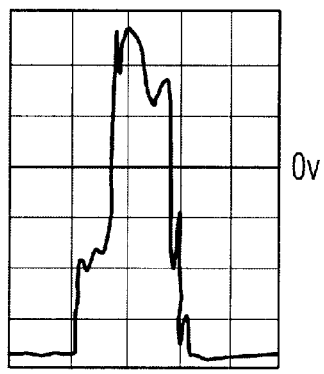
FIGS. 3(a)–3(h) are a series of RF sputtering driving waveforms that were tested under various frequency, pulse-width, power, and pressure. conditions.
Figure 3B:
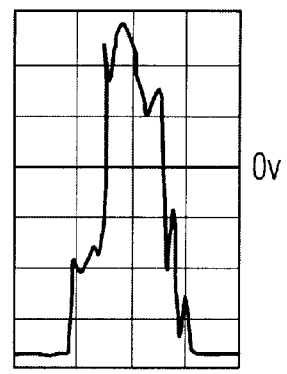
Figure 3C:
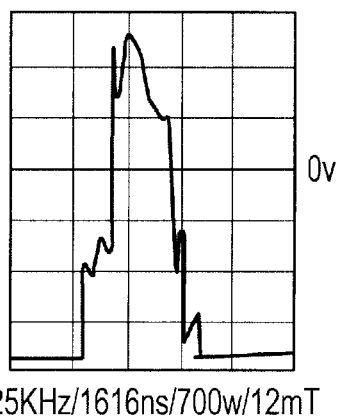
Figure 3D:
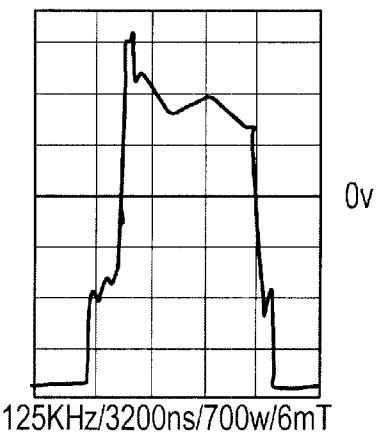
Figure 3E:
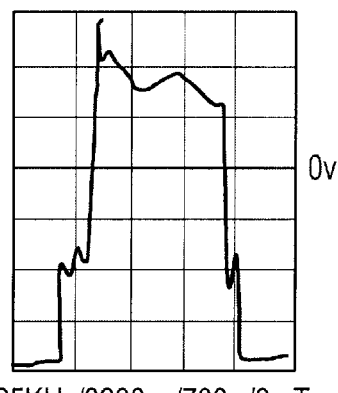
Figure 3F:
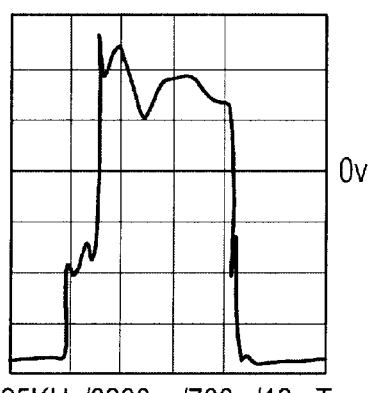
Figure 3G:
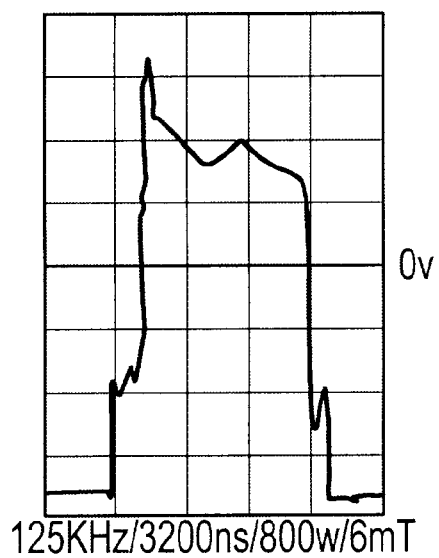
Figure 3H:
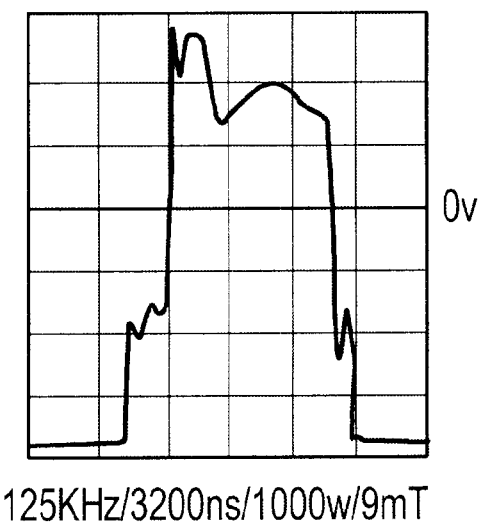
Figure 4A:
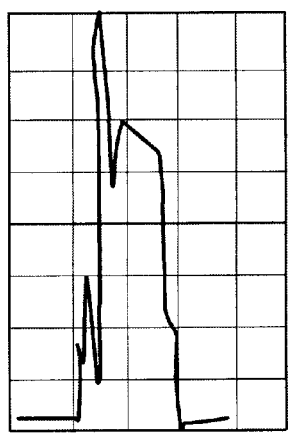
FIGS. 4(a)–4(e) are a series of RF sputtering driving waveforms that were tested under alternative frequency, pulse-width, power, and pressure conditions.
Figure 4B:
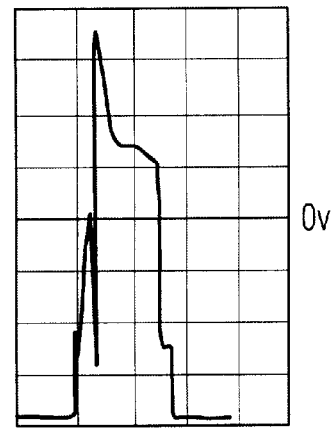
Figure 4C:
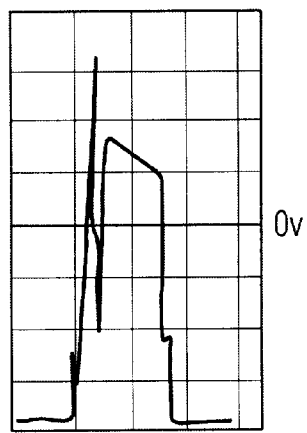
Figure 4D:
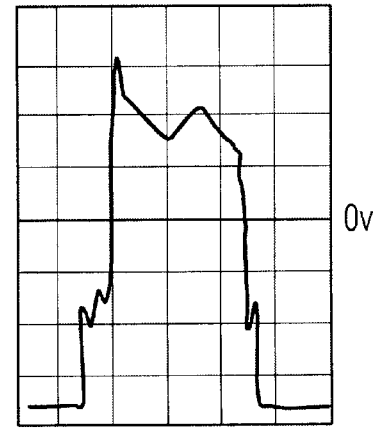
Figure 4E:
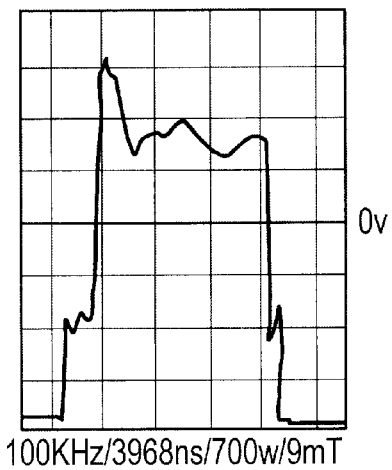

Referring now to FIG. 2, a pulsed DC sputtering configuration is used in which a pulsed DC-power supply 18 supplies the power and excites a deposition target 16. Power supply 18 is an RPG 50 Generator manufactured by ENI, a division of Astec America, Inc. and is a user programmable 5KW power supply with operational frequencies adjustable from 50 KHz to 250 KHz and is duty cycle programmable from 0 to 40%. This supply is used as an alternative to the current RF Supply having a frequency of 13.56 MHz for the prior art PZT sputtering technique.

Increased deposition rates and manufacturing throughput are possible using the sputtering configuration shown in FIG. 2. The ability to adjust frequency and pulse-width allows the user to optimize the duty cycle (sputter and discharge cycles) to maximize sputter efficiency. Pure DC cannot be utilized when sputtering nonconductive targets such as a PZT target because the constant ion bombardment will induce a build-up of positive charge on the insulating surface (which is known as target poisoning) and will eventually shut down the sputtering process. Radio frequency power supplies work well with nonconducting targets as electrons are attracted to the target surface during the positive swings of the RF cycle and discharge the surface. Of course, with the RF supply, the user is confined to equal sputter and discharge cycles (i.e., a 50% duty cycle). With a pulsed DC power supply, the duty cycle can be varied to minimize the time spent in the reverse bias (discharge) cycle and maximize time in the sputter cycle. The references to pulse width in this detailed description reflect the time in the reverse bias (i.e., the nonsputter mode).

Improved compositional control is possible using the configuration of the present invention shown in FIG. 2. By utilizing frequency and pulse-width controls, the lead content in PZT films can be varied in a window of about 10%.

The RPG 50 power supply 18 employs arc suppression circuitry, which serves to reduce particles by sensing and shutting down arcing before it can build to damaging levels. This enhances the quality of the sputtered PZT films and significantly reduce the defects that can lead to poorer PZT crystallinity.

The capabilities of the RPG 50 supply 18 are also extremely well suited for sputtering films in reactive environments (such as in an oxygen environment). This power supply can be used to obtain improvements in compositional uniformity and particle reduction when sputtering other films such as TiN, Al2O3 and AlN. In these reactive applications, it has demonstrated the potential for increasing deposition rates from 3 to 5 times.

Figure 1:
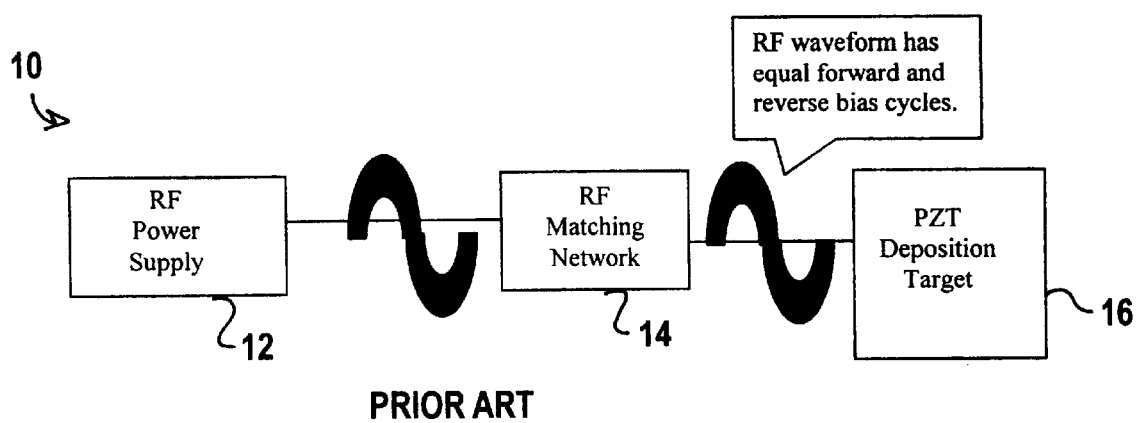
FIG. 1 is a block diagram of a typical RF sputtering configuration.

The evaluation of the sputtering method of the present invention was conducted utilizing a Gryphon deposition tool and a PZT target having a target composition as follows: 1.07 Pb/0.40 Zr/0.60 Ti/0.03 La/0.04 Ca/0.02 Sr. The RF power connection, to the top of the PZT target 16 (the cathode), was replaced with the RPG 50 power supply 18 and completely bypasses the RF tuning network 14 shown in FIG. 1. A differential voltage probe was placed between the cathode connection and ground and the signals were feed to a digital storage scope (not shown in FIG. 2). The storage scope allowed monitoring of the waveforms for various power, pressure, frequency, and pulse-width conditions to aid in establishing stable deposition parameters, as is shown in further detail below. Generally, as deposition power is increased, the most stable plasma conditions required higher frequencies (still far below RF frequencies) and longer reverse bias pulse-widths.

Several combinations of parameters were tested and, generally, power could not be pushed above 700 watts for frequencies below 125 KHz. Waveforms from some of the more stable input conditions (Power/Pressure/Frequency/Pulse-Width) are presented in FIGS. 3 and 4. The performance improves at higher pressures and at higher frequencies, as the plasma stability is enhanced.

The following sputtering conditions shown in Table 1 were tested and the corresponding driving waveforms are shown in FIGS. 3(a)–(h):

TABLE ONE

Figure Frequency Pulse-Width Power Pressure

| Fig. | Frequency | Pulse-Width | Power | Pressure |
|---|---|---|---|---|
| 3(a) | 125 KHz | 1616 ns | 700 W | 6 mT |
| 3(b) | 125 KHz | 1616 ns | 700 W | 9 mT |
| 3(c) | 125 KHz | 1616 ns | 700 W | 12 mT |
| 3(d) | 125 KHz | 3200 ns | 700 W | 6 mT |
| 3(e) | 125 KHz | 3200 ns | 700 W | 9 mT |
| 3(f) | 125 KHz | 3200 ns | 700 W | 12 mT |
| 3(g) | 125 KHz | 3200 ns | 800 W | 6 mT |
| 3(h) | 125 KHz | 3200 ns | 1000 W | 9 mT |

The following conditions shown in Table 2 were tested and the corresponding driving waveforms are shown in FIGS. 4(a)–(e):

TABLE TWO

| Fig. | Frequency | Pulse-Width | Power | Pressure |
|---|---|---|---|---|
| 4(a) | 250 KHz | 1600 ns | 700 W | 3 mT |
| 4(b) | 250 KHz | 1600 ns | 700 W | 6 mT |
| 4(c) | 250 KHz | 1600 ns | 700 W | 12 mT |
| 4(d) | 135 KHz | 2944 ns | 800 W | 8 mT |
| 4(e) | 100 KHz | 3968 ns | 700 W | 9 mT |

Figure 5:
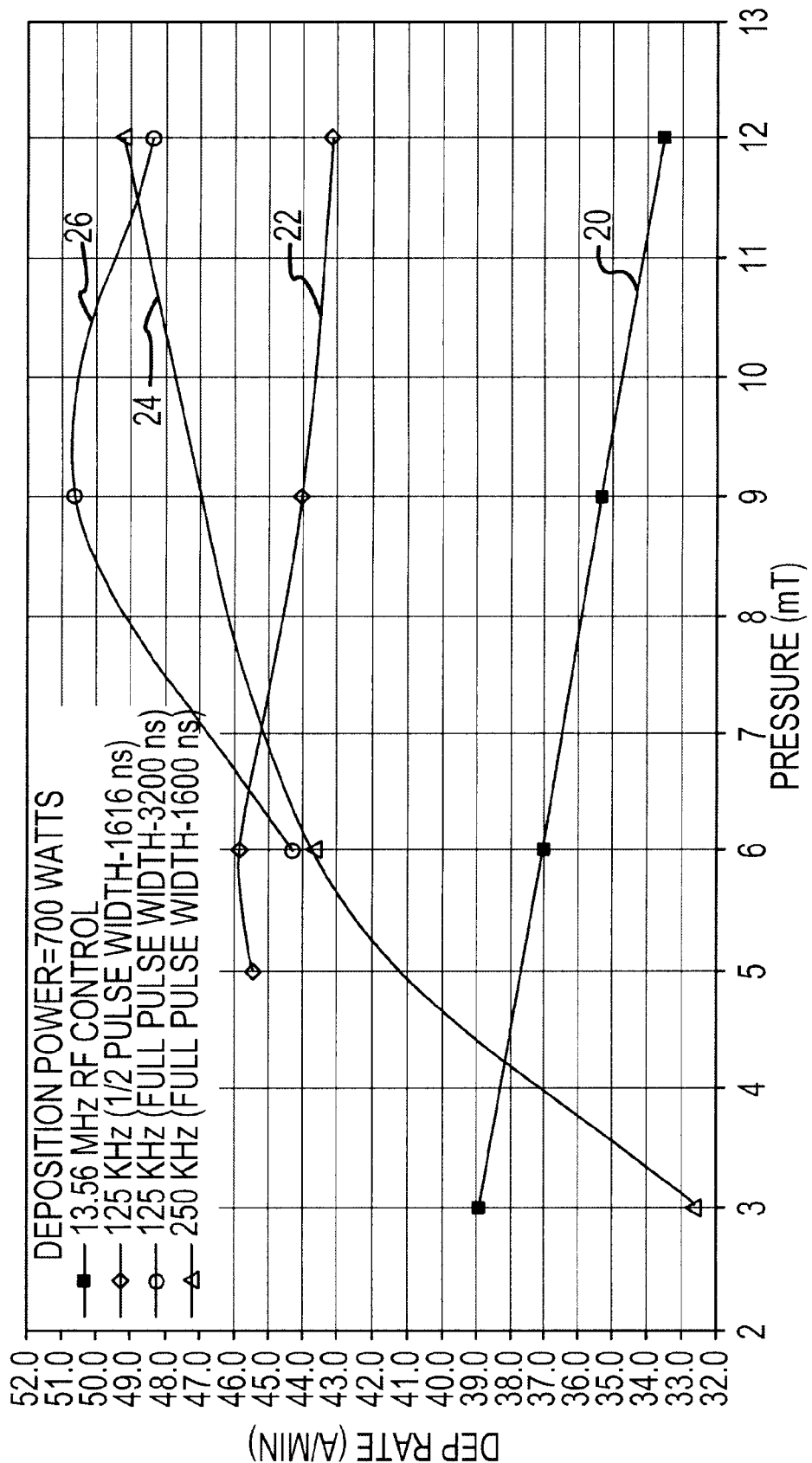
FIG. 5 is a plot showing improved deposition rates using the sputtering technique of the present invention as well as a reference RF sputtering deposition rate.
Figure 6:
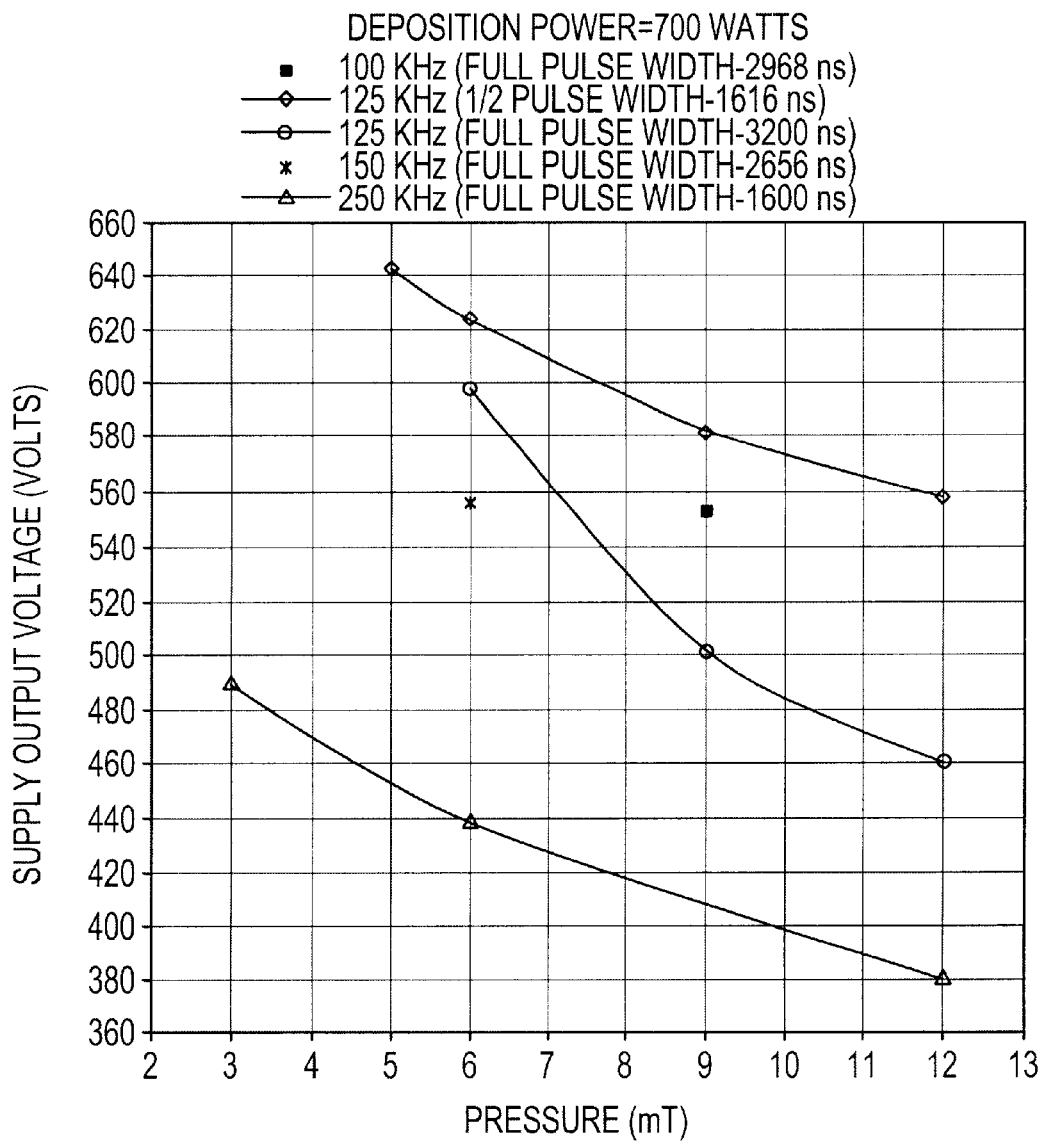
FIG. 6 is a plot of supply output voltage versus pressure using the sputtering technique of the present invention.
Figure 7:
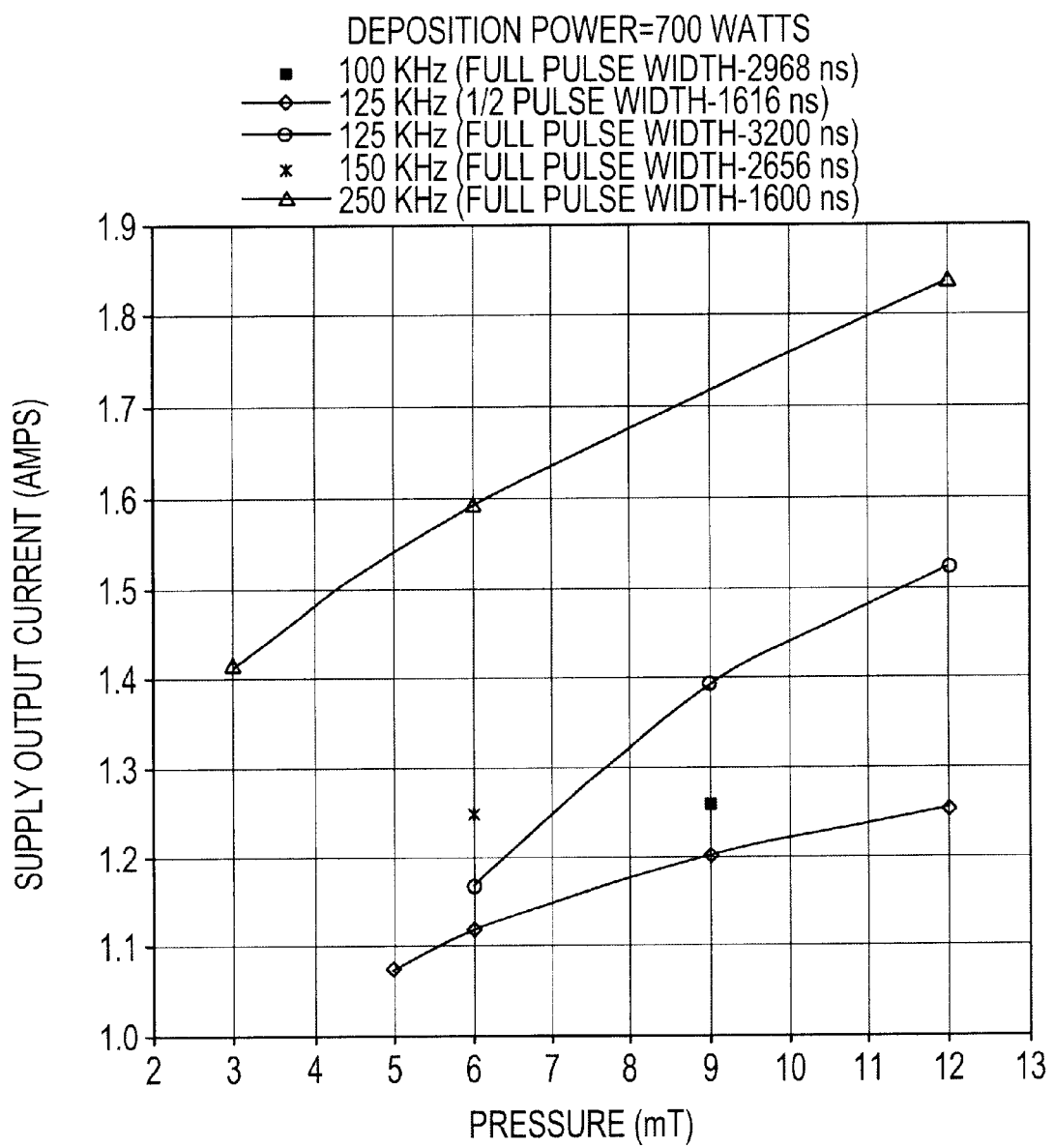
FIG. 7 is a plot of supply output current versus pressure using the sputtering technique of the present invention.
Figure 15:
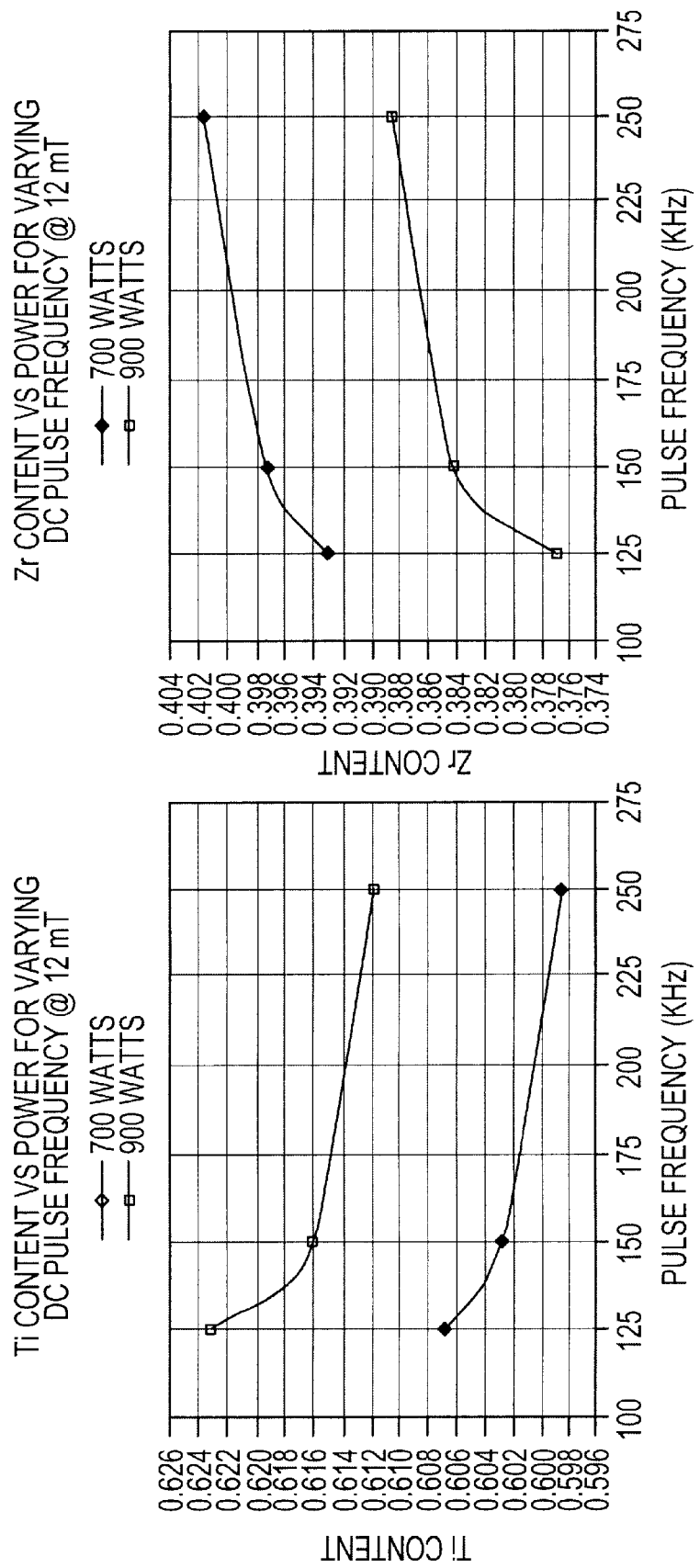
FIG. 15 is a plot of titanium content as a function of pulse frequency for the sputtering technique of the present invention.

The PZT deposition rate in Angstroms per minute is shown as a function of frequency, pulse width and pressure is shown in the graph of FIG. 15 for a fixed deposition power of 700 watts. For reference, in FIG. 5, the typical deposition rate 20 is shown using using the standard RF (13.56 MHz) power supply. The data taken at 125 KHz and 250 KHz are shown in traces 22, 24, and 26 of FIG. 5, which illustrates the potential for improvement in deposition rate using the pulsed DC power supply. The graphs of FIGS. 6 and 7 show the corresponding supply output current (FIG. 6) and voltage (FIG. 7) characteristics.

The lead content of the deposited ferroelectric film is pulse-width sensitive and becomes increasingly so at lower frequencies. At full pulse-widths, the lead content generally increases with increased frequency. The frequency/pulse width effect on dopants is relatively minor. The Ti/Zr ratio, in the usable frequency range (125–250 KHZ), is not strongly affected.

The lead content is much more pressure sensitive under the pulsed DC environment of the method of the present invention than is typically seen in the pure RF sputtering environment in the Gryphon tool. There is an increase in lead content with reduced pulse-width and the effect is reduced at higher pressures. The calcium content becomes increasingly pulse-width sensitive as pressure increases. Generally, the dopants are not significantly affected, and in particular, the calcium content is no longer strongly coupled to the lead content due to the improved lead response in a narrower pressure range. Lead control is of primary importance for consistent PZT performance. The ability to control the lead content independent of the dopants is a significant advantage. The lanthanum and strontium concentrations are not significantly affected. The Ti/Zr ratio appears to have an inverse pressure frequency interaction and is primarily pressure dominated.

Based on the characterization work described above, PZT deposition conditions were selected for the pulsed DC supply in an attempt to generate trilayer films with composition profiles replicating typical prior art RF generated films. All samples for this experiment were generated using a PZT target doped with calcium and strontium on a Gryphon sputtering machine. The starting substrates consisted of prime silicon monitors with 1000 Angstroms of USG (Unpdoped Silicate Glass) and 5000 Angstroms BPSG (Densified Boron and Phosphorous Doped Silicate Glass). The Ti/Pt bottom electrodes were 200 Angstroms Ti/1750 Angstroms Platinum with a 180 second (~180° C.) pre-heat (No Ion Etch). Two control samples were generated using the standard RF supply. In all cases the nucleation layers were targeted for a thickness of 150 Angstroms with 30% excess lead. The cap layers (for the tri-layer films) were targeted at 200 Angstroms with 40% excess lead. The total PZT thickness target was 2000 Angstroms. The details of the PZT deposition process are provided in the table shown in FIG. 8.

Referring to FIG. 8, the RF control wafers (#8 and #9) were processed with an established process for trilayer ferroelectric films. The pulsed DC films on wafers #10–16 were processed with two varieties of nucleation layer (both targeting 150 Angstroms thickness and 30% lead) and three variations in bulk layer conditions. The condition for the cap layer on the pulsed DC ferroelectric films was held constant. The samples were prepared to allow the following evaluations: RF controls versus pulsed DC controls (wafers #8 and #9 versus everything else); hold the bulk layer constant and vary the nucleation deposition process (wafer #10 versus wafer #11, wafer #14 versus wafer #16, and wafer #12 versus wafer #15); hold the nucleation layer constant and varying the bulk deposition process (wafer #10 versus wafer #14 versus wafer #15); and take a quick look at the tri-layer versus bi-layer influences (wafer #10 versus wafer #13).

After PZT deposition, all wafers received a first anneal sequence using an RTA (Rapid Thermal Anneal) to crystallize the PZT film.

Generally, the charts of FIGS. 9, 10, 11 and 12 presenting the results are set up with the control wafers #8 and #9 to the far left, followed by three groupings of pulsed DC samples based on bulk layer deposition processing. Within each pulsed DC grouping, there is a representative of each of the nucleation layer splits.

Figure 9:
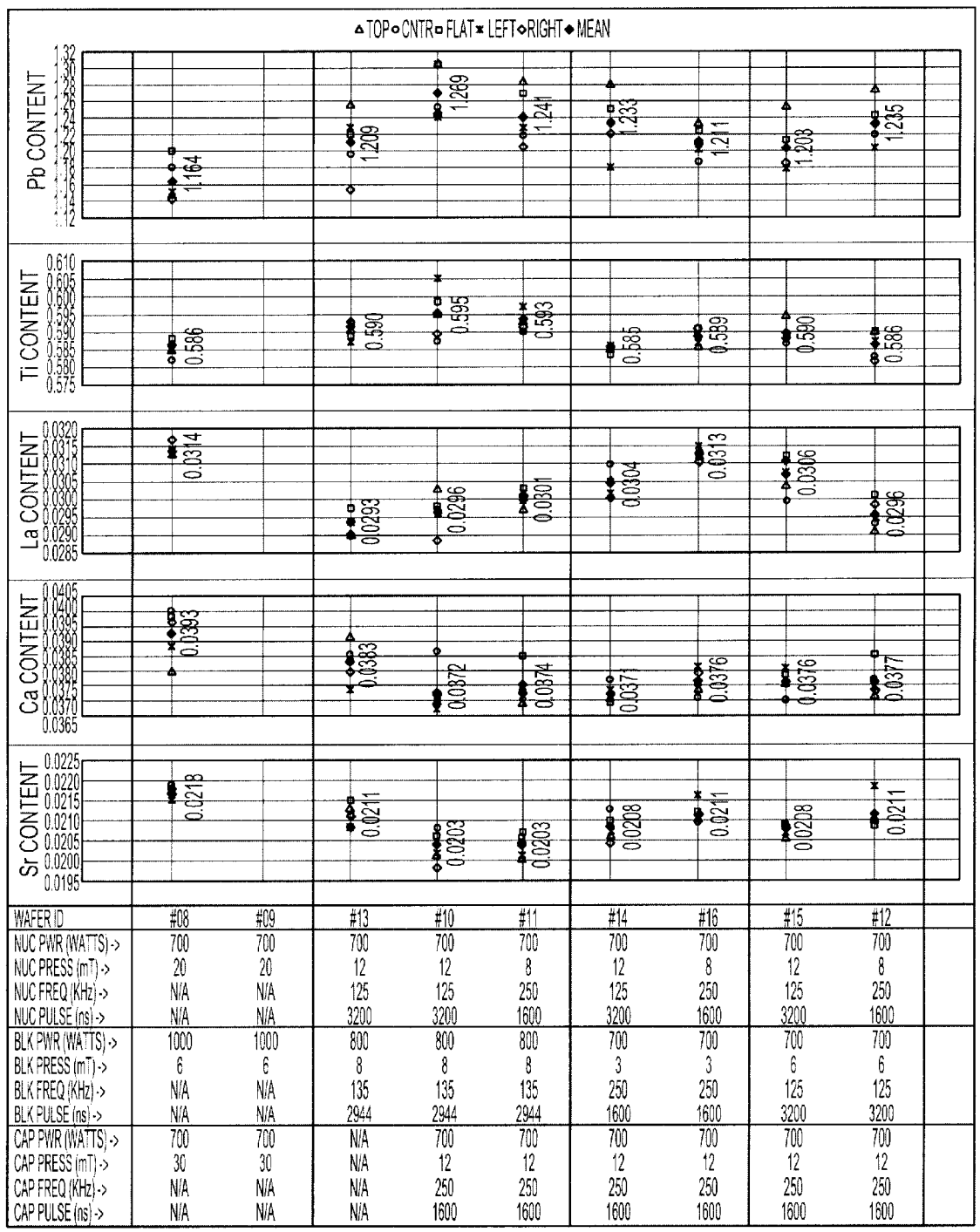
FIG. 9 shows the compositional contents for the lead, titanium, lanthanum, calcium and strontium constituents of ferroelectric films deposited according to the conditions set forth in FIG. 8.

FIG. 9 shows the attempt to match the composition of the PZT film for the sputtering conditions of FIG. 8. The amount of each of the lead, titanium, lanthanum, calcium, and strontium constituents of the sputtered ferroelectric film is shown for each of the wafers tested.

Figure 10:
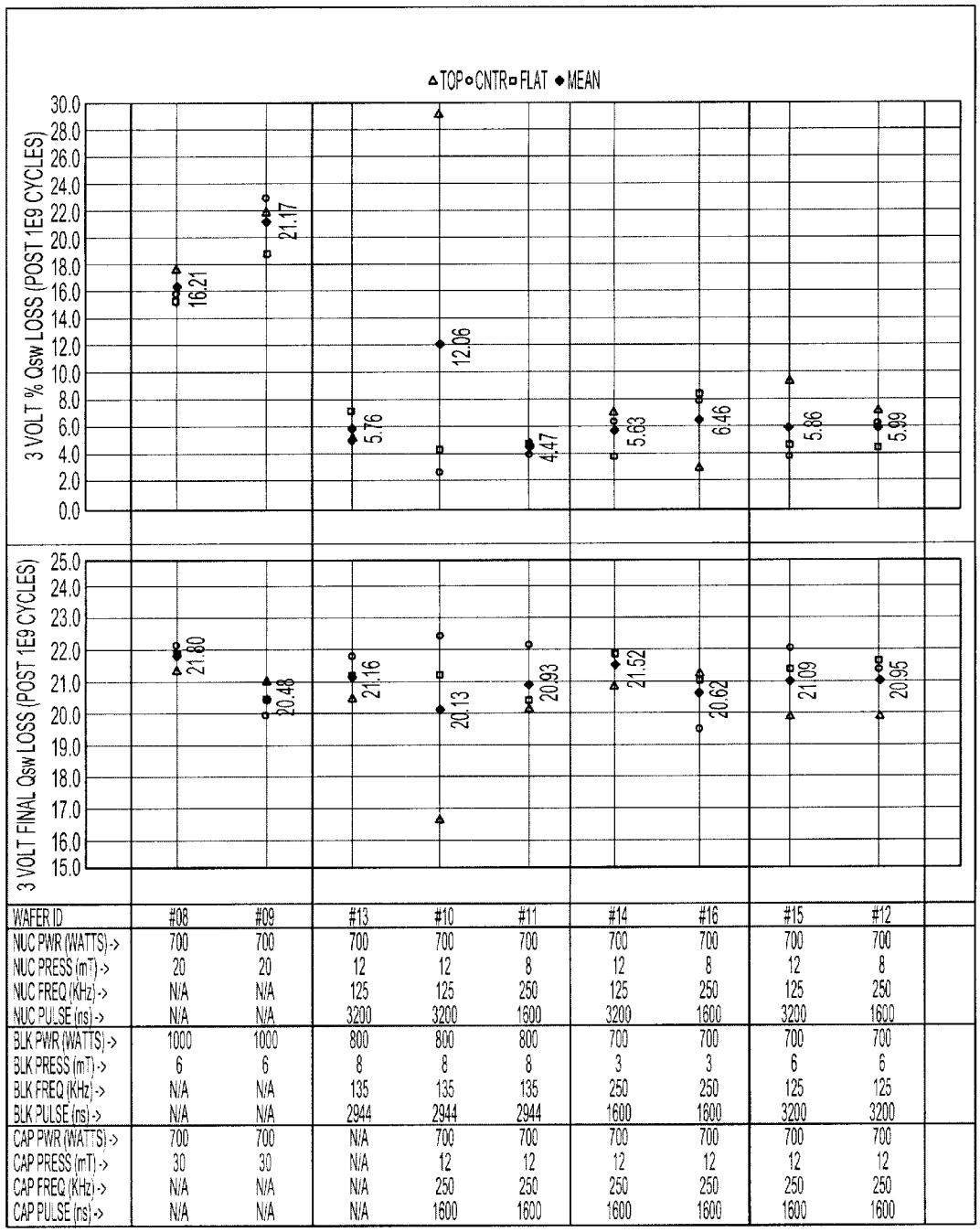
FIG. 10 shows the fatigue performance measured as a percentage of switching charge lost after 1E9 switching cycles and as the final amount of switching charge of ferroelectric films deposited according to the conditions set forth in FIG. 8.
Figure 11:
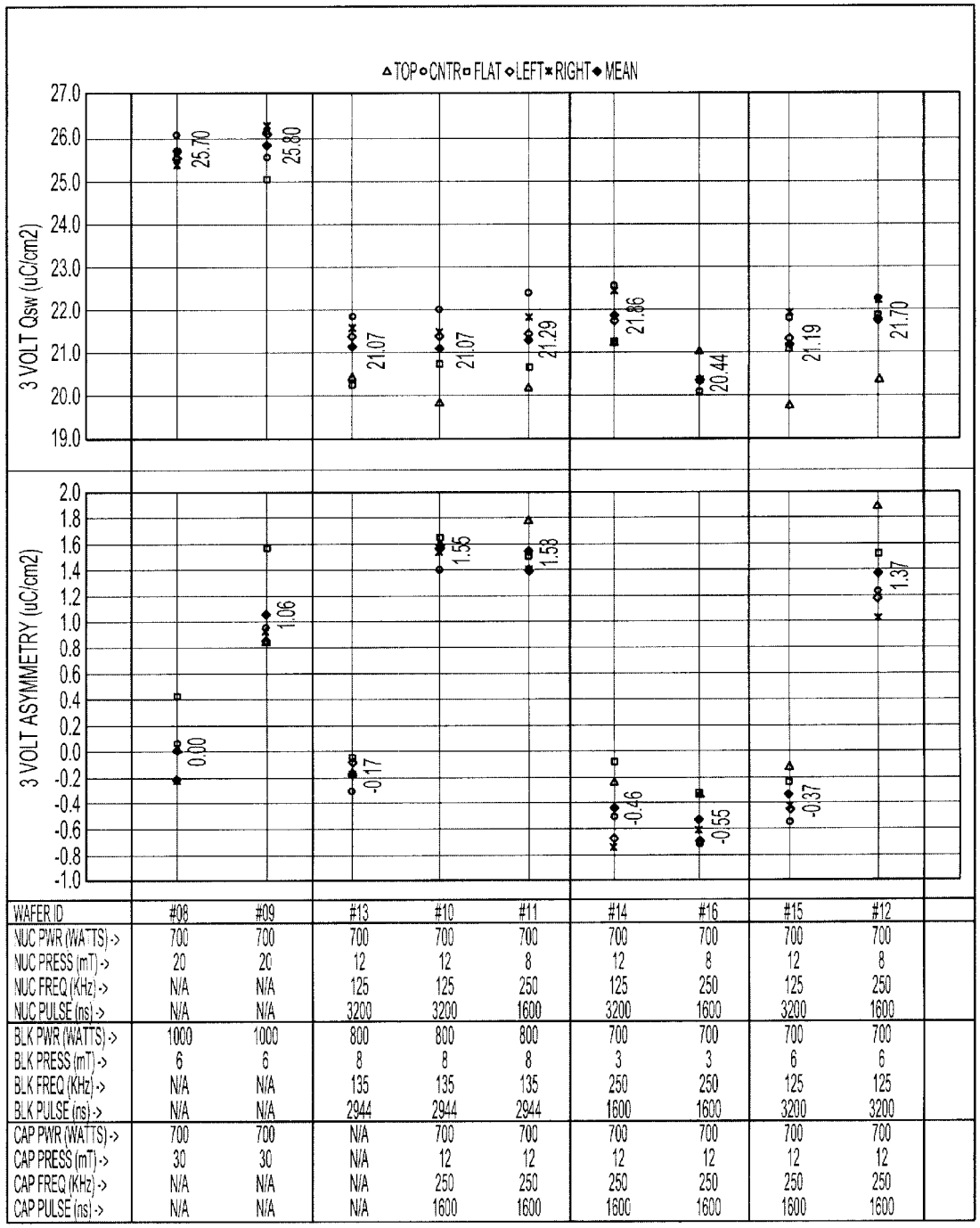
FIG. 11 shows asymmetry and switched charge of ferroelectric films deposited according to the conditions set forth in FIG. 8.

The three volt fatigue performance is presented in FIG. 10. The upper portion of FIG. 10 displays the % switching charge (Qsw) loss after 1 E9 cycles and the lower portion of FIG. 10 shows the remaining Qsw after 1 E9 cycles. As shown, the fatigue performance at three volts is significantly better for the pulsed DC samples and the three volt switching performance remains very comparable to the high frequency RF controls. Three volt asymmetry and switched charge are shown in FIG. 11.

The ability to produce functional PZT films utilizing pulsed DC was demonstrated with compositions comparable to those from the existing RF supply. Also, the pulsed DC supply exhibits an additional fine tune knob for Pb composition control utilizing the pulsewidth (duty cycle) of the applied signal.

The pulsed DC sputtering approach of the present invention shows potential for significant increases in deposition rate, while maintaining the composition control necessary to produce PZT films with respectable functionality.

There are several results generated with the pulsed DC supply which conflict with past performance in the RF environment. This strongly suggests the films produced under the pulsed DC conditions have unique properties which could potentially enhance performance.

Figure 12:
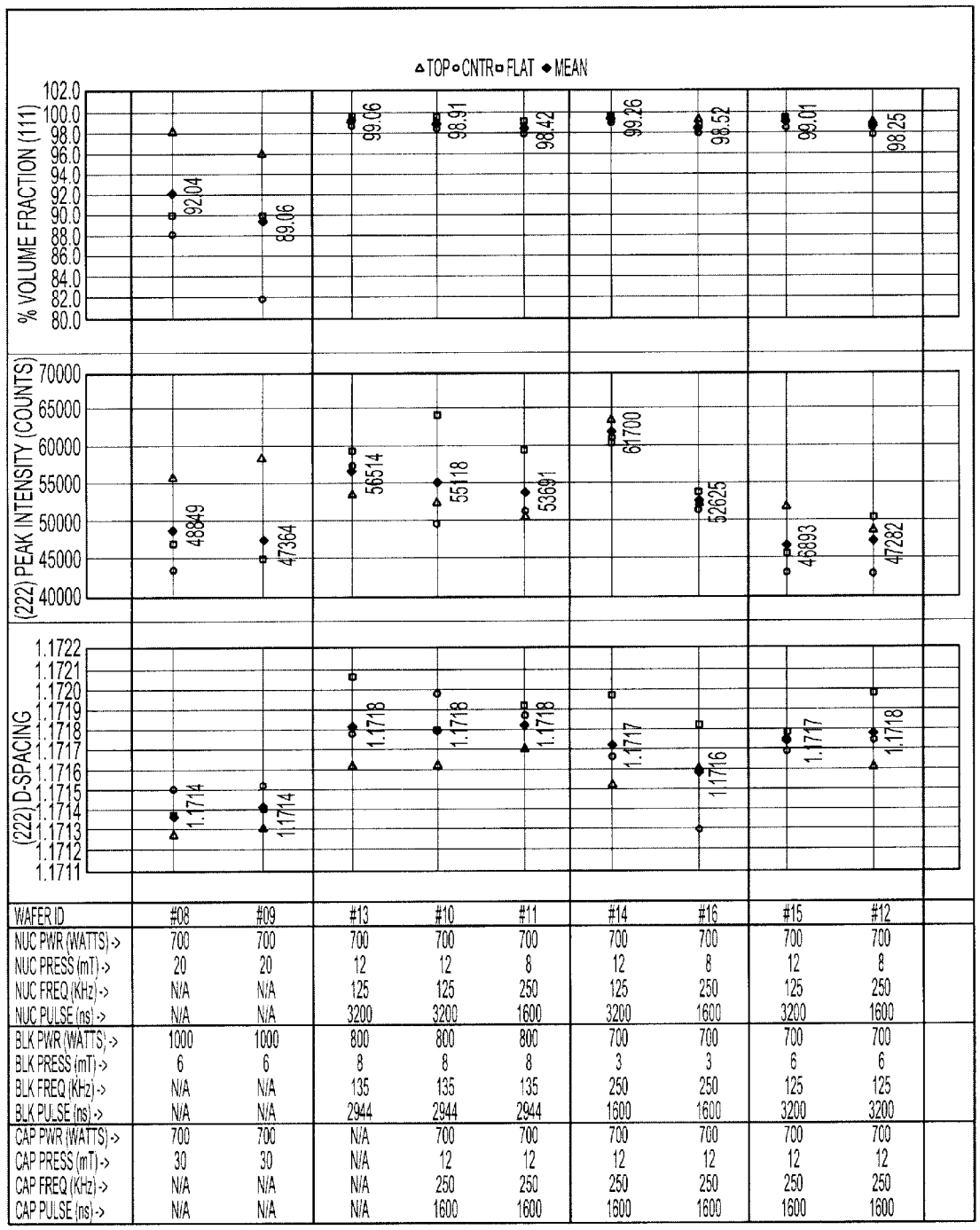
FIG. 12 shows the percent volume fraction of the desirable <111> orientated film as well as the <222> peak intensity of ferroelectric films deposited according to the conditions set forth in FIG. 8.

The pulsed DC ferroelectric films showed exceptional <111> orientation and tight cross wafer distribution despite the higher lead contents as shown in FIG. 12.

Figure 13:
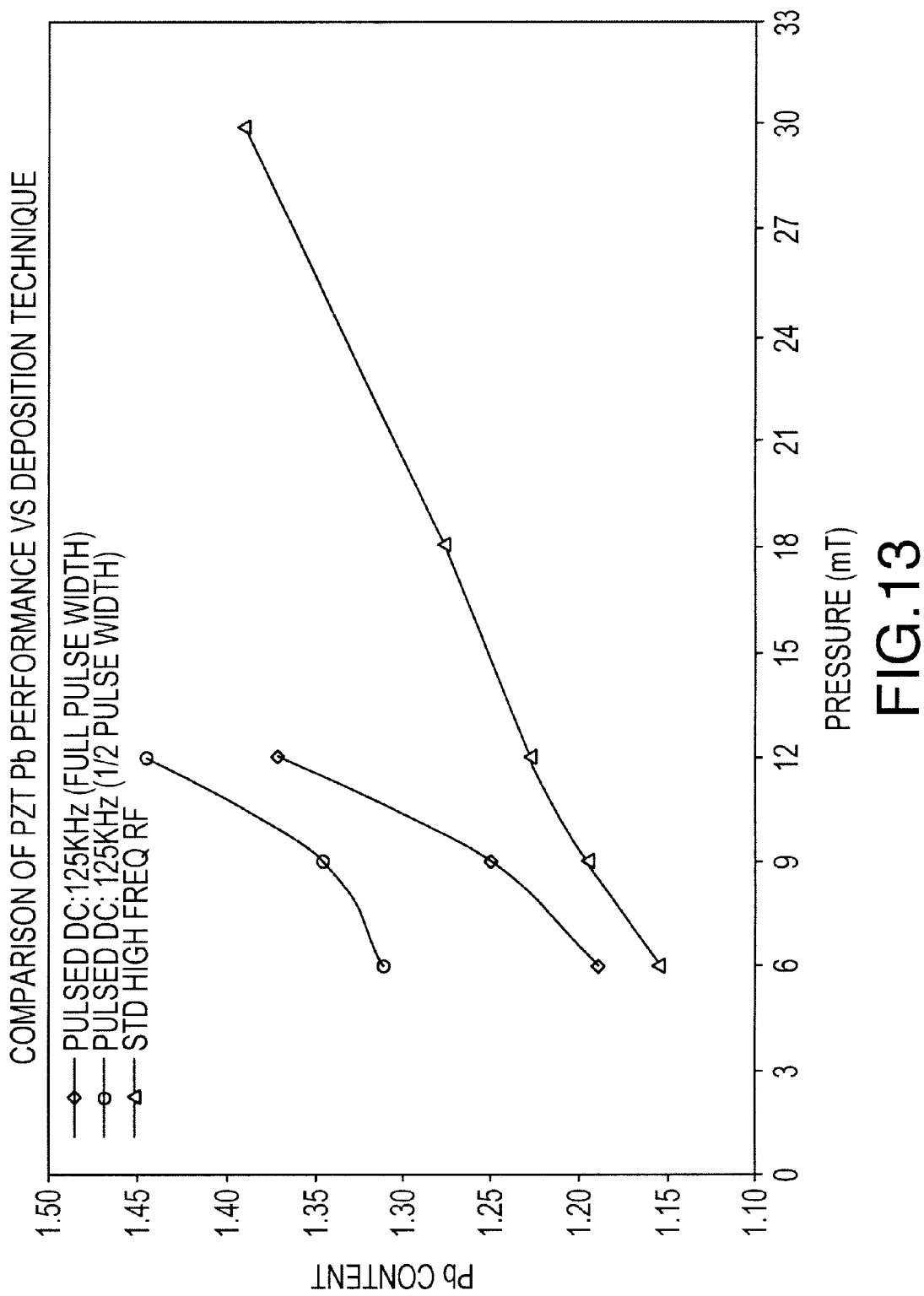
FIG. 13 is a plot of lead content as a function of pressure for the sputtering techniques of the present invention as well as the prior art RF sputtering technique.
Figure 14:
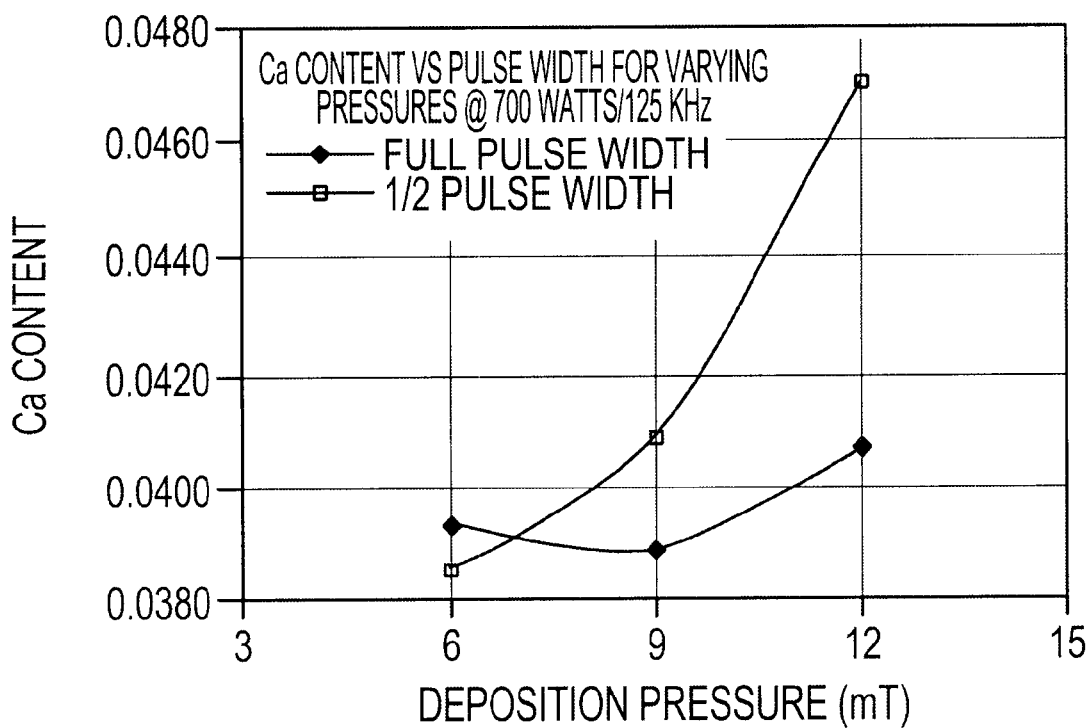
FIG. 14 is a plot of calcium content as a function of pressure for the sputtering techniques of the present invention.

Increased sensitivity between lead content and deposition pressure can be achieved with the sputtering technique of the present invention as is shown in FIG. 13. By increasing the lead response to pressure the lead and calcium contents can be decoupled. Previously lead and calcium tracked each other due to the significant deposition pressure changes required in the high frequency RF system. Depending upon process pressure, calcium content may be tunable with pulsewidth. Increased sensitivity to pulse-width with increasing pressures is shown in the graph of FIG. 14.

The Ti/Zr ratio is power sensitive in the pulsed DC environment and can be seen in FIG. 15.

Figure 16:
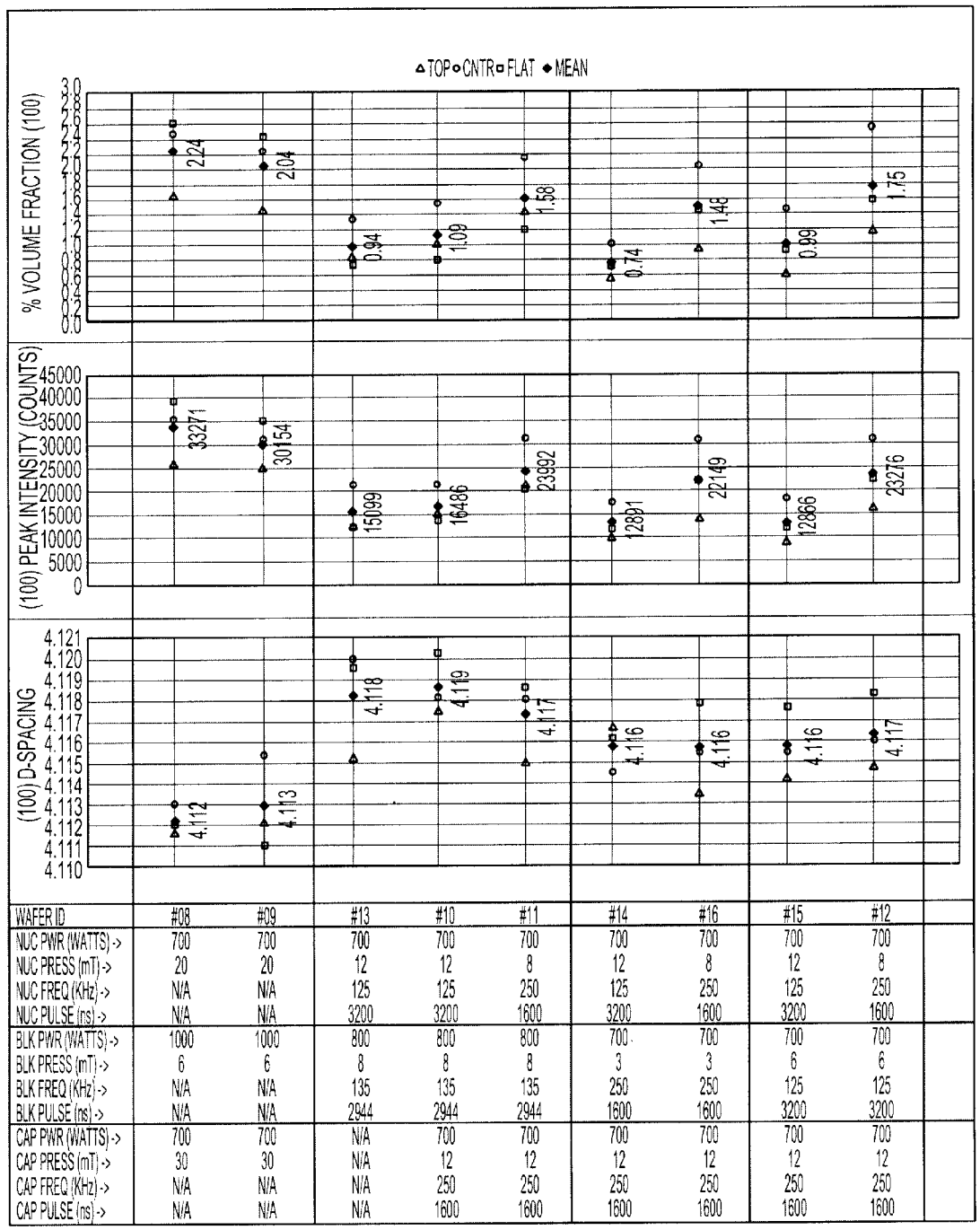
FIG. 16 shows the percent volume fraction, the peak intensity, and D-spacing of the <100> orientated film of ferroelectric films deposited according to the conditions set forth in FIG. 8.

The pulsed DC films exhibit high lead contents without the typical high <100> orientation concentrations as is shown in FIG. 16.

Figure 17:
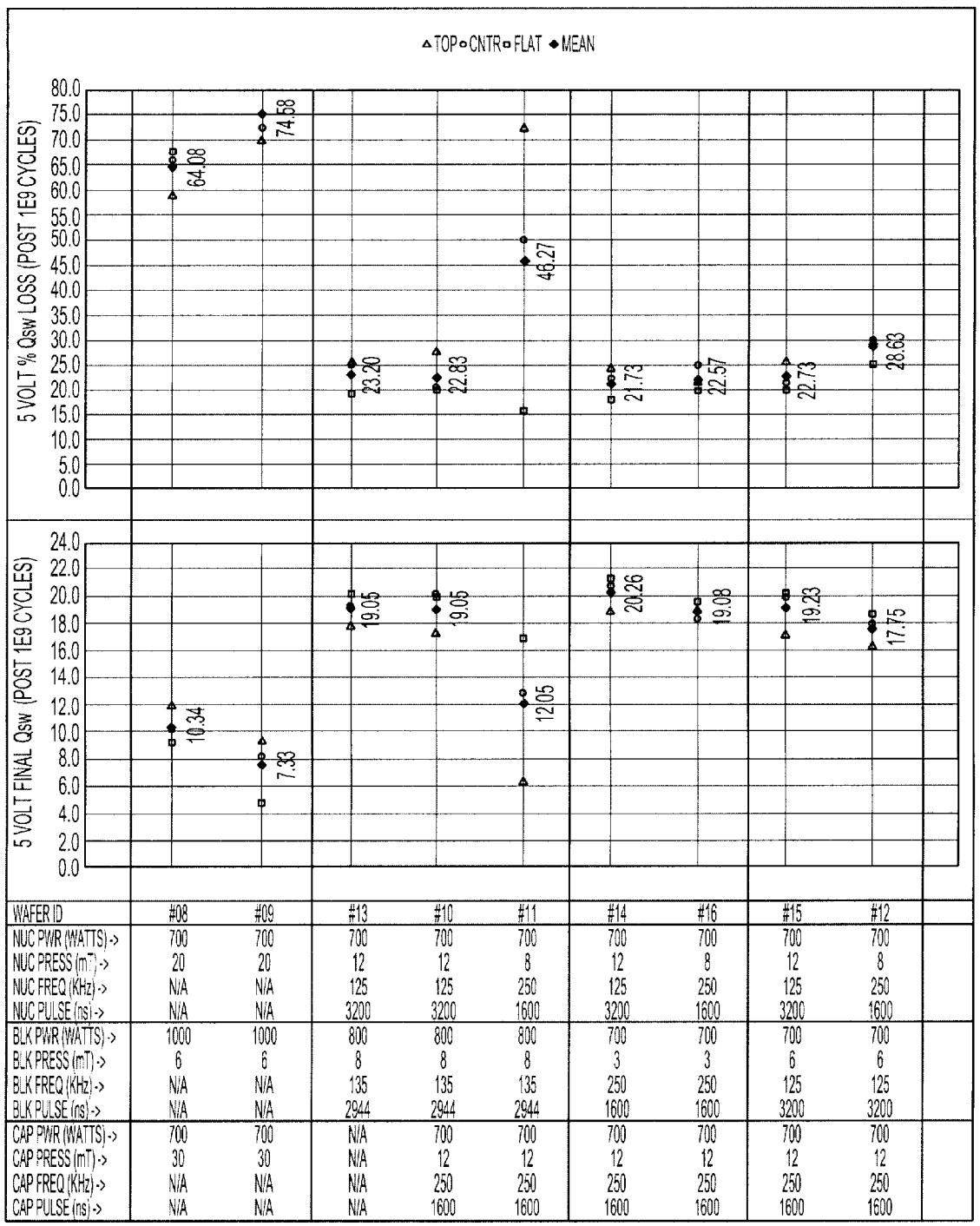
FIG. 17 shows the five volt fatigue performance of ferroelectric films deposited according to the conditions set forth in FIG. 8.
Figure 18:
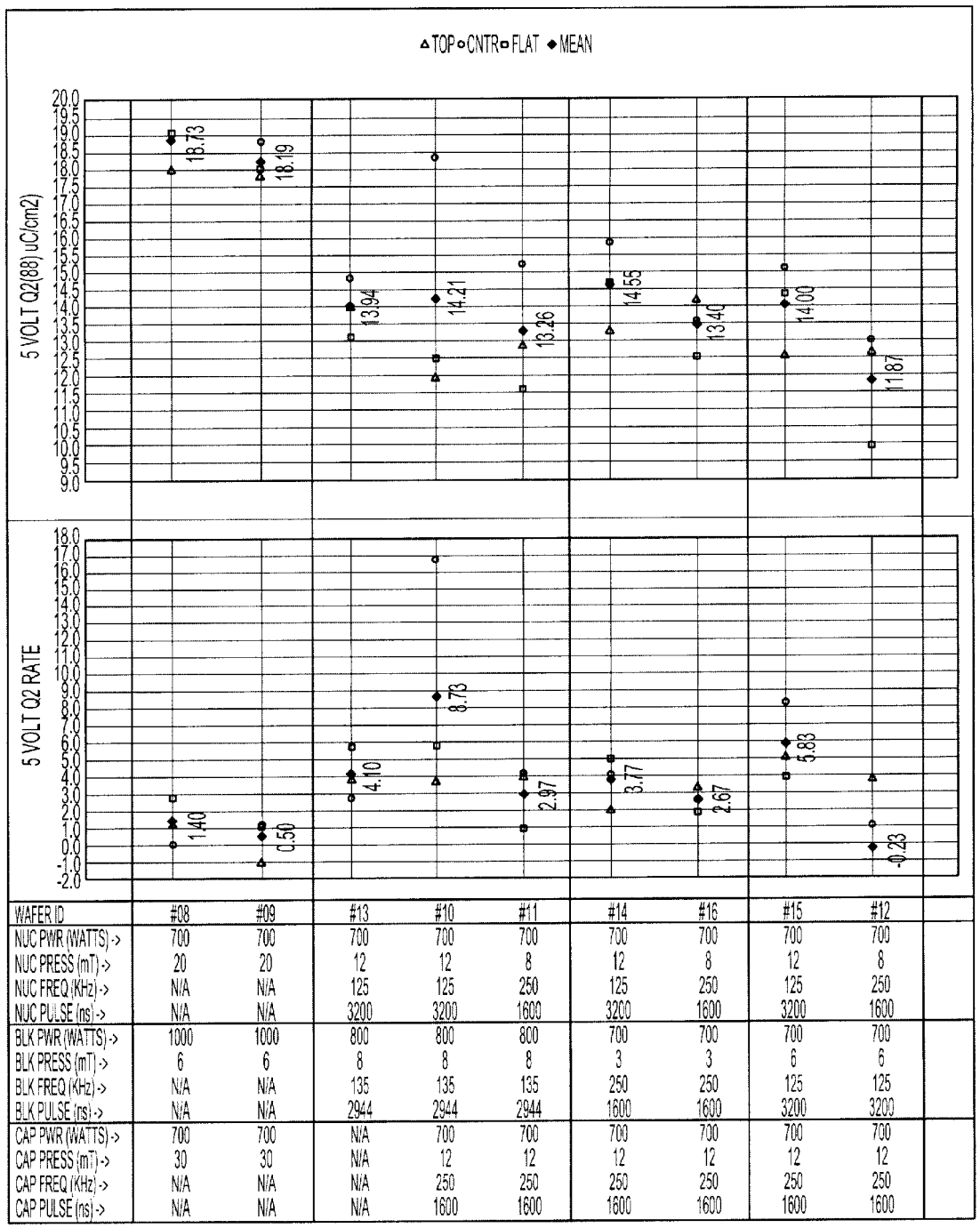
FIG. 18 shows the same-state retention performance of ferroelectric films deposited according to the conditions set forth in FIG. 8.
Figure 19:
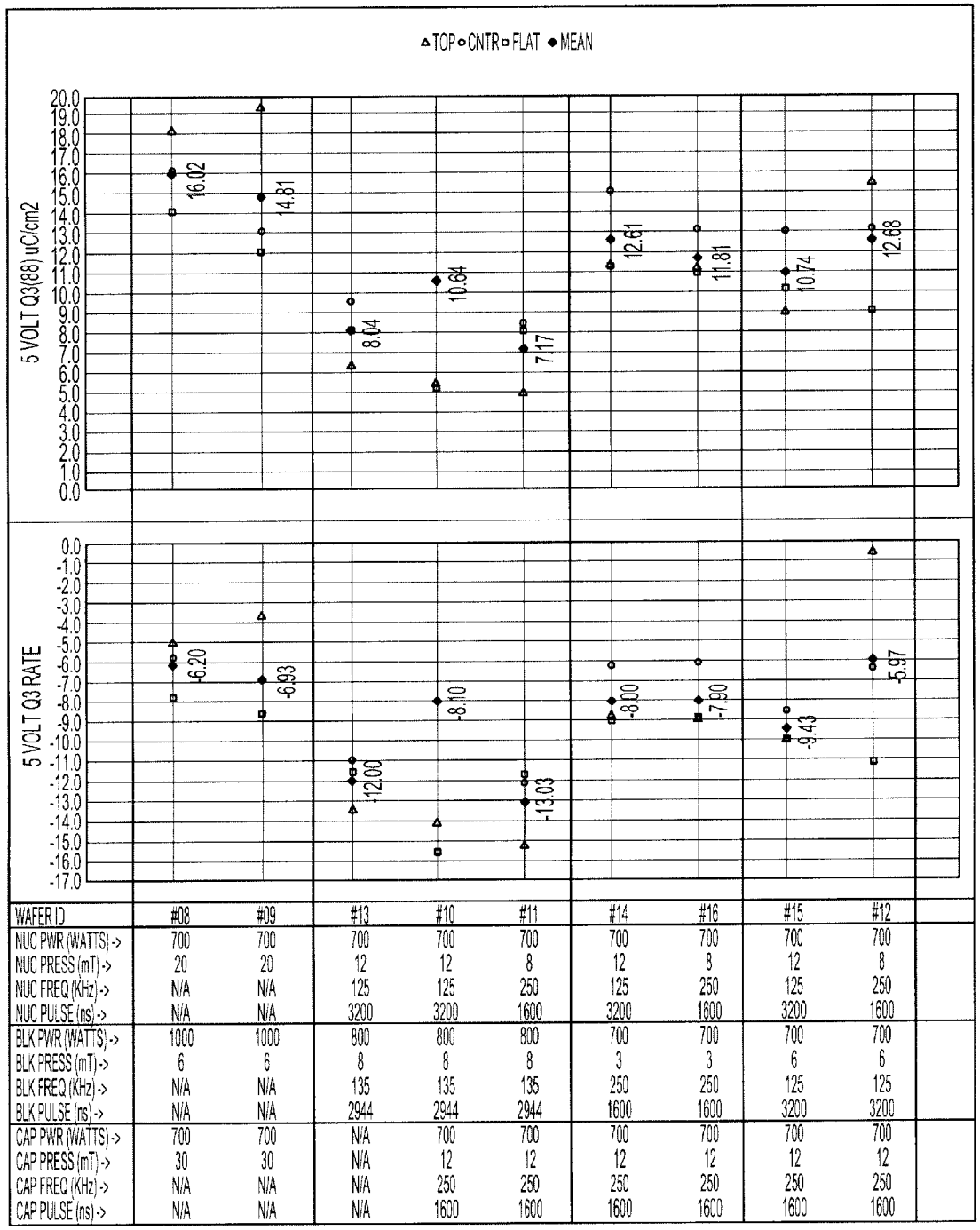
FIG. 19 shows the opposite-state imprint performance of ferroelectric films deposited according to the conditions set forth in FIG. 8.

The pulsed DC films exhibited very good five-volt fatigue performance as is seen in FIG. 17 with reasonable Q2 and Q3 performance (same state retention is shown in FIG. 18 and opposite state imprint is shown in FIG. 19).

The pulsed DC sputtering approach of the present invention is feasible and allows improvements in PZT ferroelectric film performance for use in nonvolatile ferroelectric memories.

Having described and illustrated the principle of the, invention in a preferred embodiment thereof, it is appreciated by those having skill in the art that the invention can be modified in arrangement and detail without departing to from such principles. For example, the exact time, temperature, power, pressure, frequency, and pulse-width settings can be changed as desired for a specific sputtering application. I therefore claim all modifications and variations coming within the spirit and scope of the following claims.

I claim:

1. A sputtering method comprising exciting a PZT target using a pulsed power supply in the frequency range of 100 to 250 KHz.

2. A sputtering method comprising exciting a PZT target using a low frequency power supply in the range of 200 to less than 500 KHz.

3. The sputtering method of claim 2, wherein the power supply is a pulsed DC power supply.

4. The sputtering method of claim 3, wherein the low frequency power supply used is in the range of from 200 to 250 KHz.

5. The sputtering method of claim 2, wherein the low frequency power supply used is in the range of from 200 to 250 KHz.

* * * * *